United States Patent
Yen

(10) Patent No.: US 7,468,634 B2
(45) Date of Patent: Dec. 23, 2008

(54) APPARATUS FOR CONVERTING SINGLE-ENDED SIGNAL INTO DIFFERENTIAL SIGNAL

(75) Inventor: Shin-Chieh Yen, Taipei (TW)

(73) Assignee: Realtek Semiconductor Corp., Hsinchu (TW)

( * ) Notice: Subject to any disclaimer, the term of this patent is extended or adjusted under 35 U.S.C. 154(b) by 96 days.

(21) Appl. No.: 11/519,957

(22) Filed: Sep. 13, 2006

(65) Prior Publication Data

US 2008/0061887 A1    Mar. 13, 2008

(51) Int. Cl.
*H03F 3/04* (2006.01)
(52) U.S. Cl. .................. 330/301; 330/311; 330/278
(58) Field of Classification Search .............. 330/301, 330/278, 311
See application file for complete search history.

(56) References Cited

U.S. PATENT DOCUMENTS

| | | | |
|---|---|---|---|
| 3,154,750 A | 10/1964 | David et al. | |
| 5,999,053 A | 12/1999 | Eschauzier | |
| 6,040,731 A | 3/2000 | Chen et al. | |
| 6,259,325 B1 | 7/2001 | Ishizuka et al. | |
| 6,288,609 B1 | 9/2001 | Brueske et al. | |
| 6,366,171 B1 * | 4/2002 | Litmanen et al. | 330/301 |
| 6,400,224 B2 * | 6/2002 | Gharpurey | 330/252 |
| 6,441,688 B1 * | 8/2002 | Lau et al. | 330/301 |
| 6,771,127 B2 * | 8/2004 | Mulder et al. | 330/258 |
| 6,813,486 B2 * | 11/2004 | Sayers | 455/338 |
| 7,035,616 B2 * | 4/2006 | Reynolds | 455/326 |
| 7,265,623 B2 * | 9/2007 | Bhattacharjee et al. | 330/254 |

FOREIGN PATENT DOCUMENTS

GB    2321148    7/1998

OTHER PUBLICATIONS

RSGB Radio Communications Handbook 5th edition, 1982, p. 6.20.

* cited by examiner

*Primary Examiner*—Patricia Nguyen
(74) *Attorney, Agent, or Firm*—Rosenberg, Klein & Lee

(57) ABSTRACT

The present invention discloses a single-ended input/differential output amplifier includes a first bonding wire, a transduction gain circuit coupled to the first bonding wire for receiving an input voltage, a gain control circuit coupled to the transduction gain, a load unit with an end coupled to the gain control circuit to form a first output end, and a second bonding wire coupled to another end of the load unit to form a second output end.

23 Claims, 2 Drawing Sheets

APPARATUS FOR CONVERTING SINGLE-ENDED SIGNAL INTO DIFFERENTIAL SIGNAL

FIELD OF THE INVENTION

The present invention generally relates to converters, and more particularly relates to a single-ended input/differential output converters.

BACKGROUND OF THE INVENTION

In most radio frequency circuit designs, an unbalanced microstrip line architecture is generally adopted and a balun is usually required for converting signals between chips and circuits. However, the use of baluns not only increases costs, but also causes additional signal losses, increased noise, and decreased signal power, which will damage the overall circuit characteristics. Since a radio frequency chip adopts a single-ended input design, therefore the cost can be reduced and the circuit characteristics can be enhanced. For example, a radio frequency receiver has a low-noise single-ended amplifier at its utmost front end, and a next-stage mixer is provided for preventing local oscillation signals leaking to a radio frequency end and an intermediate frequency end or a baseband end. The double balanced architecture is generally used, but the radio frequency input end of the double balanced mixer is a differential input, and thus it is necessary to install a conversion circuit between a low-noise amplifier and a down-conversion mixer for converting a single-ended signal into a differential signal.

In the prior art, the conversion circuit is installed in a chip as shown in FIG. 1, which externally inputs a single-ended signal into a transduction circuit 10, and the current produced by the transduction circuit 10 is passed through a gain control circuit 12 to a load circuit 14 and the input impedance 16 of a next-stage circuit (such as a down-conversion mixer), and the transduction gain of the transduction circuit 10 is gm, wherein the gain of the gain control circuit 12 is a. the load circuit 14 and the next-stage circuit having an input impedance 16 are coupled to a first bonding wire 18 and a second bonding wire 20 respectively. If the impedances of the load circuit 14, the next-stage circuit 16, the first bonding wire 18 and the second bonding wire 20 are $Z_L$, $Z_m$, $Z_1$, and $Z_2$ respectively, the gain of this conventional conversion circuit will be given as follows:

$$A_v = \frac{V_{out}}{V_{in}} = a \cdot gm\left(\frac{Z_L Z_m}{Z_L + Z_m + Z_1 + Z_2} + \frac{Z_1 Z_m}{Z_L + Z_m + Z_1 + Z_2}\right) + (1-a) \cdot gm\left(\frac{Z_1 Z_m}{Z_m + Z_1 + Z_2}\right)$$

In the abovementioned equation, the term $Z_1+Z_2$ will make it difficult to control the gain of the conventional conversion circuit, and the range of the gain of the conventional conversion circuit is limited by two terms $$a \cdot gm\left(\frac{Z_1 Z_m}{Z_L + Z_m + Z_1 + Z_2}\right) \text{ and } (1-a) \cdot gm\left(\frac{Z_1 Z_m}{Z_m + Z_1 + Z_2}\right).$$

Further, the impedance of the conventional conversion circuit as shown in FIG. 1 is equal to the sum of the load circuit 14 and the first bonding wire 18, and the gain of the conventional conversion circuit cannot be predicted. In addition, it is necessary to have a very good AC ground for Point P at the junction of the load circuit 14 and the first bonding wire 18, or else the control of gain will not be accurate, and the output voltage Vout is closely related to the wire bonding, manufacturing process, and packaging, and thus will be varied easily by these factors.

SUMMARY OF THE INVENTION

Therefore, it is a primary objective of the present invention to provide a single-ended input/differential output amplifier, which will not be affected by its manufacturing process and packaging.

Another objective of the present invention is to provide a single-ended input/differential output amplifier, which can accurately control its current gain control.

A further objective of the present invention is to provide a single-ended input/differential output amplifier, which has a better common mode noise rejection ratio (CMRR).

In a preferred embodiment of the present invention, a single-ended input/differential output amplifier comprises a first bonding wire; a transduction circuit coupled to the first bonding wire for receiving an input voltage, a gain control circuit coupled to the transduction circuit, a load unit having an end coupled to the gain control circuit to form a first output end, and a second bonding wire coupled to another end of the load unit to form a second output end.

DETAILED DESCRIPTION OF THE PREFERRED EMBODIMENTS

To make it easier for our examiner to understand the objective of the invention, its innovative features and performance, a detailed description and technical characteristics of the present invention are described together with the drawings as follows.

Figure 1:
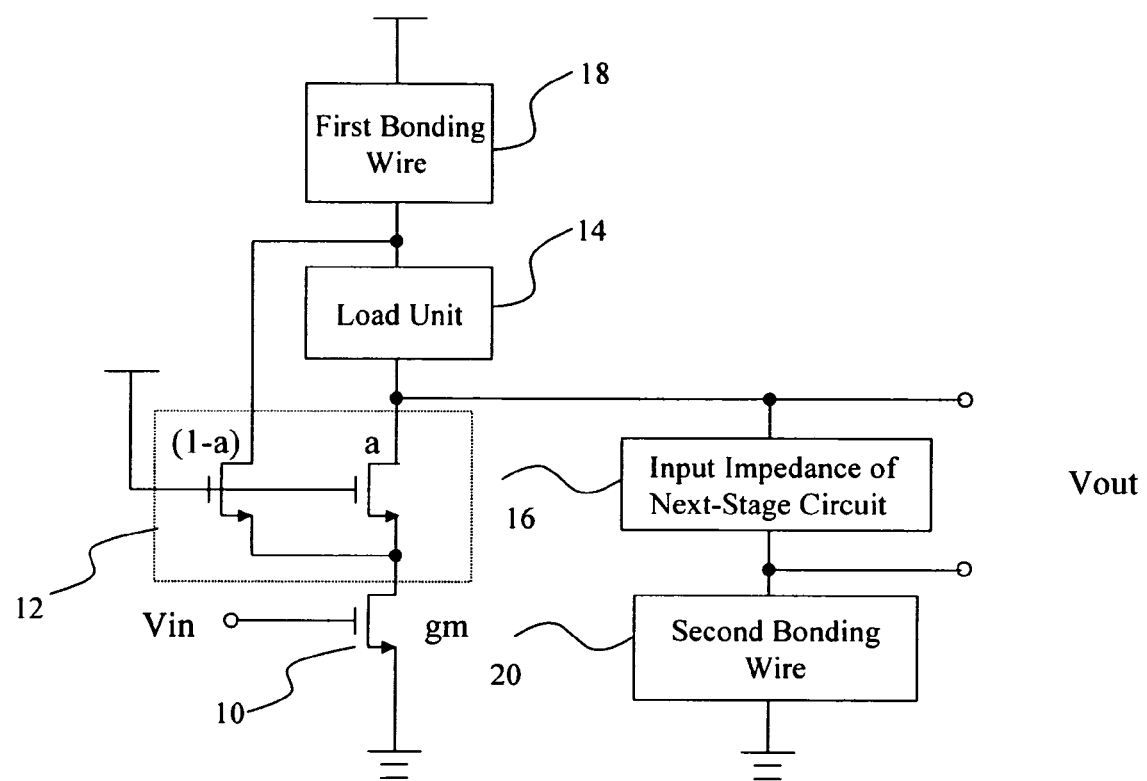
FIG. 1 is a block diagram of a prior art single-ended voltage input amplifier.
Figure 2:
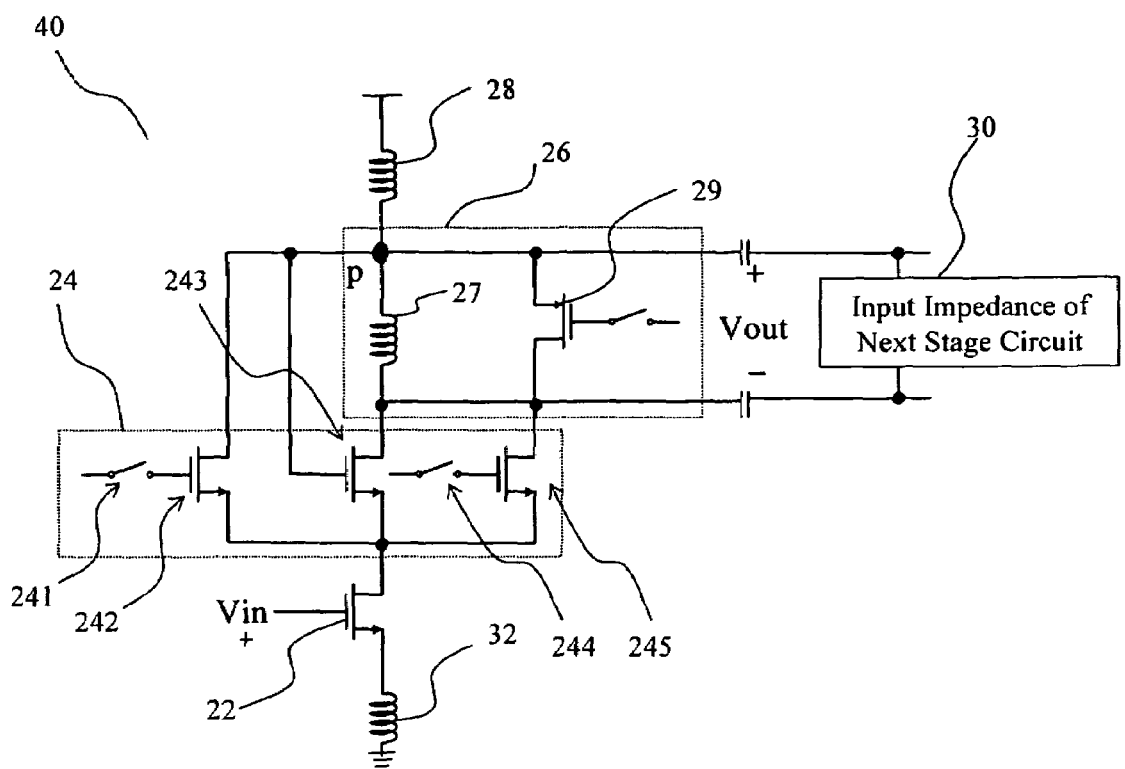
FIG. 2 is a block diagram of the present invention.

Referring to FIG. 2 for the single-ended input/differential output amplifier 40 according to a preferred embodiment of the present invention, the amplifier 40 comprises a transduction circuit 22, a gain control circuit 24, and a load circuit 26, and the transduction circuit 22 has a transduction gain gm and is provided for receiving an input signal Vin to output a current, and the gain control circuit 24 is coupled to the transduction circuit 22 for modulating the current gain, and the load circuit 26 is coupled to the gain control circuit 24 and both end points of the load circuit 26 are differential output ends. In addition, the source of the transduction gain circuit 22 is coupled to a bonding wire 32, and another end of the bonding wire 32 is coupled to ground, and an end of the load circuit 26 is coupled to a bonding wire 28. In this preferred embodiment, the transduction circuit 22 can be a transistor for converting the input signal Vin into a current. In the preferred embodiment, the gain control circuit 24 comprises at least one first switch 241, at least one first transistor 242, a transistor 243, at least one second switch 244, and at least one second transistor 245, and their connections are shown in FIG. 2. These switches and transistors are provided for controlling the current flow passing through the load circuit 26. In the preferred embodiment, the parameter of the at least one first switch 241 and the at least one second switch 244 are complementary with each other.

In the preferred embodiment, the load circuit 26 comprises an inductor 27 and a load unit 29, and the load unit 29 is controlled such that the impedance of the load circuit can be adjusted, and the embodiment of the load unit 29 is a transistor.

In the preferred embodiment, both ends of the load unit 26 are coupled separately to a first capacitor and a second capacitor for outputting the differential signal by an AC couple method.

In FIG. 2, the parameter of the at least one second switch 244 in the gain control circuit 24 is a, the parameter of the at least one first switch 241 is 1-a, and the impedance of the load circuit 26 and the input impedance 30 of the next-stage circuit and the impedance of the bonding wire 28 are $Z_L$, $Z_m$, and $Z_1$, and the gain factor of the amplifier 40 according to the invention is given as follows:

$$A_v = \frac{V_{out}}{V_{in}} = a \cdot gm\left(\frac{Z_L Z_m}{Z_L + Z_m}\right)$$

From the equation above, the terms a and $Z_L$ can affect the gain of the amplifier 40 in accordance with the present invention, and the transduction value gm of the transduction gain circuit 22 and impedance $Z_1$ of the bonding wire 28 will not affect the result of the equation above. Since the transduction value gm and the impedance $Z_1$ cannot affect the gain of the amplifier 40 and the gain of the amplifier 40 can be controlled in a designed range and predicted more easily.

In the preferred embodiment, the impedance $Z_1$ of the bonding wire 28 has no significant effect on the gain of the amplifier 40 and does not rely on a perfect AC ground at point P' to accurately control the current gain control, and the output voltage Vout will not be affected by the bonding wire, manufacturing process and packaging as easily. Further, the common mode noise rejection ratio (CMRR) of the amplifying method of the invention is substantially equal to that of the differential circuit.

Please note that when the conversion circuit according to the invention does not need to connect the pin(s) of the IC, the bonding wire 28, 32 can be omitted. In an embodiment, when the gain of the conversion circuit according to the invention is fixed, the gain control circuit 24 can be omitted.

While the invention has been described by way of example and in terms of a preferred embodiment, it is to be understood that the invention is not limited thereto. To the contrary, it is intended to cover various modifications and similar arrangements and procedures, and the scope of the appended claims therefore should be accorded the broadest interpretation so as to encompass all such modifications and similar arrangements and procedures.

What is claimed is:

1. An apparatus for converting a single-end input signal into a differential output signal, comprising:
   a transduction circuit for receiving the single-end input signal to generate a first current;
   a gain control circuit, coupled to said transduction circuit, for controlling an amount of the first current; and
   a load circuit, having a first end coupled to said gain control circuit to form a first output end and a second end coupled to a second output end, the load circuit receives the first current to generate the differential output signal;
   wherein said first and second output ends are used for outputting the differential output signal.

2. The apparatus of claim 1, wherein said first and second output ends are coupled to a first capacitor and a second capacitor respectively for differentially outputting said differential output signal.

3. The apparatus of claim 1, wherein a gain of said apparatus is substantially independent on an impedance of a bonding wire.

4. The apparatus of claim 3, wherein said transduction circuit comprises a transistor.

5. The apparatus of claim 1, wherein said transduction circuit comprises a transistor.

6. The apparatus of claim 5, wherein said gain control circuit comprises a plurality of transistors and a plurality of switches, and each of said switches is coupled to said corresponding transistor.

7. The apparatus of claim 6, wherein each source of the plurality of transistors is coupled to the transduction circuit.

8. The apparatus of claim 1, wherein said gain control circuit comprises a plurality of transistors and a plurality of switches, and each of the switches is coupled to said corresponding transistor.

9. The apparatus of claim 8, wherein each source of said plurality of transistors is coupled to said transduction circuit.

10. The apparatus of claim 1, wherein said apparatus outputs said differential output signal to a mixer.

11. The apparatus of claim 1, wherein said load circuit comprises an inductor.

12. The apparatus of claim 11, wherein said load circuit further comprises a transistor coupled to said inductor in parallel.

13. An apparatus for converting a single-end input signal into a differential output signal, comprising:
   an amplifying circuit for receiving the single-end input signal and outputting an amplified signal corresponding to the single-end input signal; and
   a load circuit having a first end coupled to said amplifying circuit to form a first output end and a second end coupled to a second output end, wherein the load circuit receives the amplified signal to generate the differential output signal;
   wherein said first and second output ends are used for outputting the differential output signal;
   wherein a gain of the apparatus is substantially independent on an impedance of a bonding wire.

14. The apparatus of claim 13, wherein the amplifying circuit comprises:
   a transduction circuit receiving the single-end input signal and outputting a first current according to a transduction gain; and
   a gain control circuit, coupled to said transduction circuit, receiving the first current and controlling an amount of the first current flowing through the load circuit.

15. The apparatus of claim 14, wherein the transduction circuit comprises a transistor.

16. The apparatus of claim 14, wherein the gain control circuit comprises:
   at least one first transistor;
   at least one first switch, each of the at least one first switch coupled to the corresponding first transistor;
   at least one second transistor; and
   at least one second switch, each of the at least one second switch coupled to the corresponding second transistor.

17. The apparatus of claim 13, wherein said load circuit comprises a transistor coupled to an inductor in parallel.

18. The apparatus of claim 17, wherein the transistor is used for adjusting an impedance of the load circuit.

19. The apparatus of claim 13, wherein the apparatus outputs the differential output signal to a mixer.

20. The apparatus of claim 13, wherein said first and second output ends are coupled to a first capacitor and a second capacitor respectively for differentially outputting said differential output signal.

21. An apparatus for converting a single-end input signal into a differential output signal, comprising:
   an amplifying circuit for receiving the single-end input signal and outputting an amplified signal corresponding to the single-end input signal; and
   a load circuit having a first end coupled to said amplifying circuit to form a first output end and a second end coupled to a second output end,
   wherein the load circuit receives the amplified signal to generate the differential output signal;
   wherein said first and second output ends are used for outputting the differential output signal;
   wherein said load circuit comprises a transistor coupled to an inductor in parallel.

22. The apparatus of claim 21, wherein the transistor is used for adjusting an impedance of the load circuit.

23. The apparatus of claim 21, wherein said first and second output ends are coupled to a first capacitor and a second capacitor respectively for differentially outputting said differential output signal.

* * * * *